United States Patent
Perroni et al.

(10) Patent No.: US 6,894,914 B2
(45) Date of Patent: May 17, 2005

(54) NONVOLATILE MEMORY DEVICE WITH PARALLEL AND SERIAL FUNCTIONING MODE AND SELECTABLE COMMUNICATION PROTOCOL

(75) Inventors: Maurizio Perroni, Furnari (IT); Salvatore Polizzi, Palermo (IT)

(73) Assignee: STMicroelectronics S.r.l., Agrate Brianza (MI) (IT)

(*) Notice: Subject to any disclaimer, the term of this patent is extended or adjusted under 35 U.S.C. 154(b) by 234 days.

(21) Appl. No.: 10/270,021

(22) Filed: Oct. 11, 2002

(65) Prior Publication Data

US 2003/0090939 A1 May 15, 2003

(30) Foreign Application Priority Data

Oct. 12, 2001 (IT) .................................. VA2001A0034

(51) Int. Cl.[7] .................................................. G11C 5/06
(52) U.S. Cl. .............................. 365/63; 365/201; 712/29
(58) Field of Search ........................... 365/63, 201, 51; 712/29, 36

(56) References Cited

U.S. PATENT DOCUMENTS 5,896,534 A * 4/1999 Pearce et al. ................. 710/17
6,311,263 B1 * 10/2001 Barlow et al. ................ 712/36

* cited by examiner

Primary Examiner—Son T. Dinh
(74) Attorney, Agent, or Firm—Lisa K. Jorgenson; Bryan A. Santarelli; Graybeal Jackson Haley LLP

(57) ABSTRACT

An architecture of a nonvolatile memory device, though not requiring dedicated pins and by introducing circuit modifications that require a negligible additional silicon area in the serial interface, allows a selection between at least two different serial communication protocols, thus multiplying the occasions of employment of the same device. The selection of one or of the another serial communication protocol is carried out by setting, during the testing on wafer (EWS) of the devices being fabricated, a certain UPROM cell of the array of UPROM cells that is normally present in a standard nonvolatile memory device for setting during the fabrication the characteristics of ATD, redundancy and other functions of the memory device. Alternatively, the customer can make the selection by placing an appropriate signal level on a specified pin of the memory device.

25 Claims, 5 Drawing Sheets

NONVOLATILE MEMORY DEVICE WITH PARALLEL AND SERIAL FUNCTIONING MODE AND SELECTABLE COMMUNICATION PROTOCOL

CROSS-REFERENCE TO RELATED APPLICATIONS

The present application claims priority from Italian patent application no. VA2001A000034, filed Oct. 12, 2001, presently pending.

FIELD OF THE INVENTION

The present invention relates to a standard nonvolatile memory device operating in parallel mode through a relative interface with an input/output data bus or in serial mode through a specific interface configurable during the fabrication phase or by means of an external command to operate according to one of different serial communication protocols selectable depending on the needs or preferences.

BACKGROUND OF THE INVENTION

There are countless applications for memory devices capable of storing in a nonvolatile manner large quantities of data to be saved or made accessible in a successive time by a processor, such as for instance memory devices for PCBios applications coupled to a PCI bus, in digital cameras, electronic agendas, measuring instruments, electronic equipment of vehicles and the like.

Nowadays, the memory devices most frequently used in these applications are the so-called FLASH memories.

Data may be written in the memory and read from it, making the data available through an interface circuit.

A standard FLASH memory device embodies address circuitry, row and column decoding circuits, data read and write circuits, controlled by a memory controller, often in the form of a microcontroller integrated in the same device. The functioning mode of a standard FLASH memory device is parallel through a control and input/output bus whose lines are connected to as many pins of the device.

The controller of a FLASH memory device coordinates the recording of the information acquired in specific locations of the memory cell array from which data may be successively read and made available to the external circuitry.

Of course, the memory controller performs all functions necessary to ensure a correct functioning of the device, by establishing redundancy or by-pass functions of locations of defective cells during the read and write cycles.

Often these FLASH memory devices include also a serial interface designed for implementing or supporting a certain serial communication protocol that determines, by using a clock signal, the execution of the distinct steps of the communication protocol, both during a data read phase and a data write phase.

Very often the serial communication protocol is of the type known as LPC (acronym for Low Pin Count).

In many applications, the parallel mode is used during the testing on wafer (EWS) of the device being fabricated and eventually for accelerating the writing of a large quantity of data to be written in the memory in a substantially permanent fashion.

For a chip manufacturer, the compatibility of a certain nonvolatile memory device with the different (or potentially different) requisites of its customers—typically manufacturers of electronic equipment—has a great importance.

The possibility of making a mass production memory device compatible with a specific serial communication protocol according to the requirements of a customer in a "final" sequence of steps of the fabrication process produces a non negligible economy of scale, because of the possibility of fabricating devices in augmented quantities for satisfying the needs of a number of customers.

The advantage of producing a device whose serial communication protocol could be selected by establishing a certain logic state on a pin of the device itself would be even more significant, because the user would have the possibility of choosing among different serial communication protocols by conditioning the same finished product.

On another side, in these kinds of devices, the available number of pins remains a relatively critical design aspect and it is generally difficult to render available pins for implementing other functions beside those more directly correlated to the functions of an already complex memory device. Moreover, the integration of additional circuit blocks destined to the execution of alternatively selectable functions such as would be the case of selectable multiple serial interfaces, each dedicated to implement a certain communication protocol, implies problematic costs/benefit consideration for devices in which a large memory capacity is favored when dimensions and the packaging of the device are pre-established.

SUMMARY OF THE INVENTION

An architecture of a nonvolatile memory device has been found that, though not requiring dedicated pins and by introducing circuit modifications that require a negligible additional silicon area in the serial interface, allows a selection at least between two different serial communication protocols, thus multiplying the occasions of employment of the same device.

According to a first embodiment, the selection of one or of the another serial communication protocol is carried out by setting, during the testing on wafer (EWS) of the devices being fabricated, a certain UPROM cell of the array of UPROM cells that is normally present in a standard nonvolatile memory device for setting during the fabrication the characteristics of ATD, redundancy and other functions of the memory device.

According to an alternative embodiment of the invention, the protocol selection may be done through a pin wired to the input/output data bus of the memory device that is not used during the functioning of the device in serial mode. Practically the pin used for serial protocol selection may corresponds to a pin of the input/output data bus when the device operates in parallel mode through the relative parallel mode interface.

For instance, in a memory device having an eight bit input/output data bus (eight lines connected to eight pins of the device), each line of the bus coupled to a respective input/output buffer is normally used as are the other lines to let the memory communicate with the external world. One of these lines, when the device operates in parallel mode, constitutes an input line to transfer to the memory a datum to be programmed during a data write phase and an output line of a datum read from the memory during a data read phase.

When the memory device switches to a serial functioning mode, for instance using an LPC protocol, usually only four lines of the data bus are used and the I/O buffers of unused lines of the input/output data bus do not support any transfer of information. These unused I/O structures may be defined as RFU (Reserved for Future Use) resources and one of these lines, corresponding to a certain external pin, is exploited according to this alternate embodiment of the invention to allow a selection of the desired serial communication protocol among the selectable ones.

Both embodiments of this invention enhance economy of scale in producing the memory device. Moreover, in the case of the latter embodiment, the final user will be free to decide which one of the serial mode protocols to use by simply driving to a certain logic state a certain pin of the memory device.

DESCRIPTION OF EMBODIMENTS OF THE INVENTION

Figure 1:
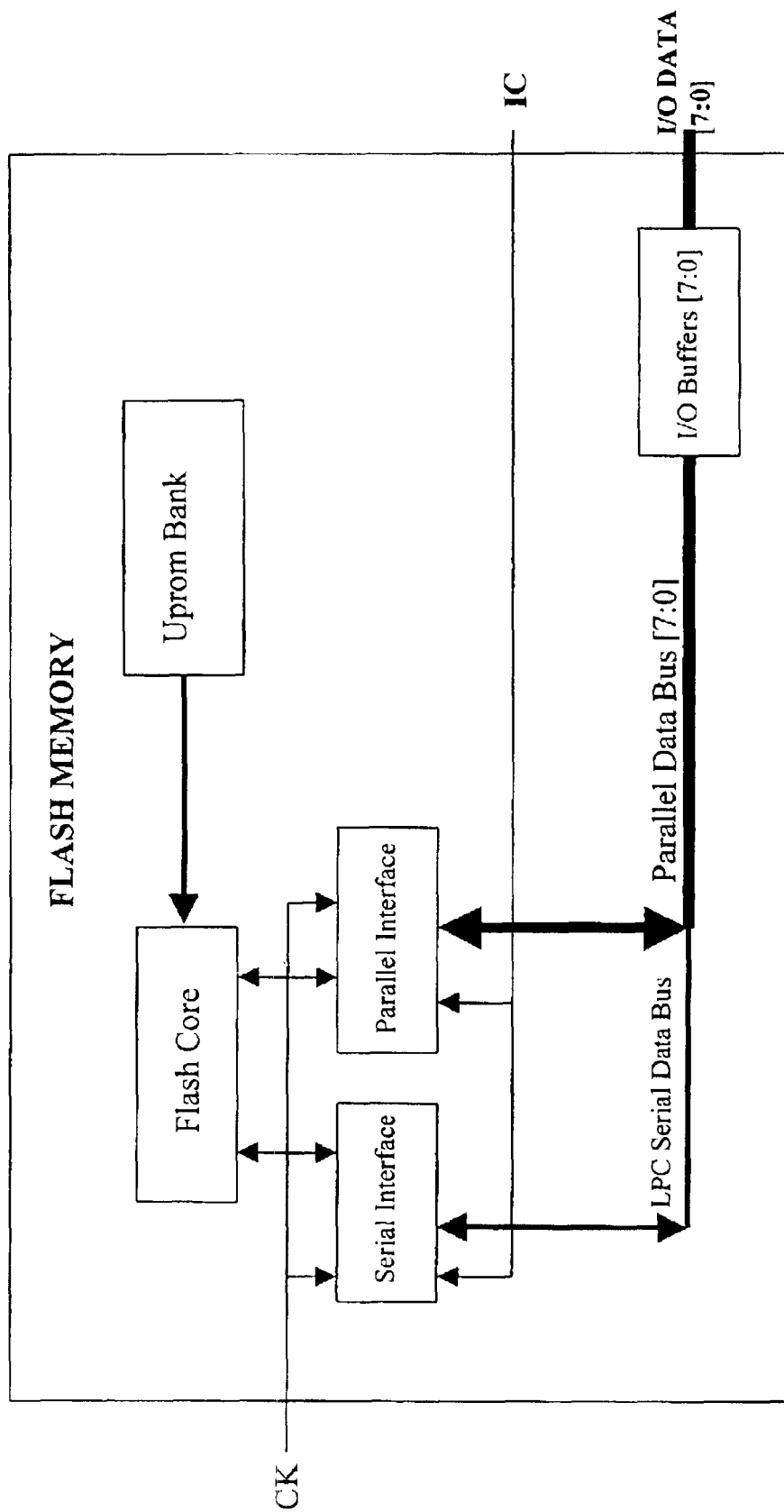
FIG. 1 is a functional block diagram of a nonvolatile memory device according to a common architecture of this kind of devices provided also with a serial interface.

For illustrative purposes, the typical basic block diagram of a known nonvolatile memory device FLASH MEMORY is shown in FIG. 1.

The diagram highlights the functional parts pertaining to the embodiments of the present invention, identifying in a single block, FLASH CORE, the integrated standard memory. Beside the array, subdivided or not in sectors, of common FLASH memory cells, addressable through row and column decoding circuits, the FLASH CORE includes all the logic circuitry for managing the input and output of data, the decoding circuits, as well as the controller that may be constituted by a microprocessor dedicated to the managing of the memory device, of eventual redundancy cell arrays and the like functions of a "standard" memory.

The array of read only memory cells UPROM BANK is highlighted in a separate block. As it is well known to one of skill in the art, various parameters and operating characteristics of the memory device are set during the testing on wafer (EWS) of the devices being fabricated, according to commonly used techniques.

The basic functional block diagram of FIG. 1 further highlights the parallel interface circuit, PARALLEL INTERFACE, the data bus PARALLEL DATA BUS [7:0], which in the sample illustration is composed of eight bits (eight lines), and a serial interface block, SERIAL INTERFACE, for instance of the commonly used LPC kind, coupled to four lines of the eight-line data bus.

The array of input/output buffers of the lines of the data bus connected to the pins of the device is identified by the block I/O BUFFERS.

Figure 2:
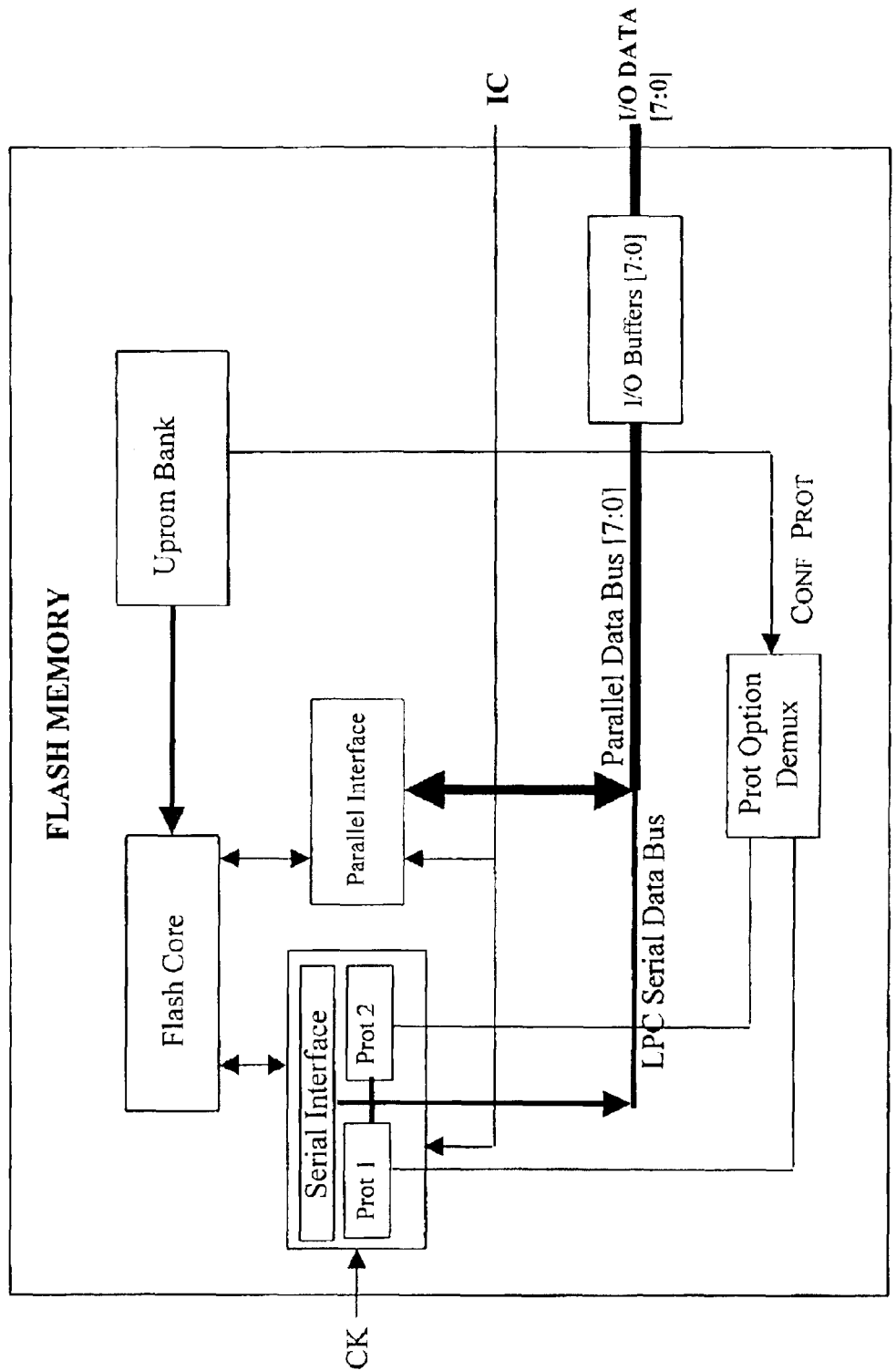
FIG. 2 is a functional block diagram of a nonvolatile memory device realized according to a first embodiment of the present invention.

FIG. 2 is a basic diagram of the nonvolatile memory device of this invention according to a first embodiment.

For ease of illustration, the diagram is structured in the same fashion of the known device of FIG. 1, to highlight better the parts that implement the setting of the relevant interface circuitry for a certain serial communication protocol between two (according to the embodiment shown) supported protocols alternatively selectable.

According to this embodiment, the setting of the desired serial communication protocol may advantageously take place during the testing on wafer (EWS) of the devices being fabricated.

According to the indications of the customer, a cell of the array UPROM BANK of read only cells of configuration of the memory device, is dedicated to the setting, in this case in an unchangeable and permanent manner, of the chosen serial communication protocol.

The setting for a selected protocol is carried out by the block PROT OPTION DEMUX, in response to the programming of the dedicated read only cell that accordingly sets the CONF_PROT signal.

The serial interface circuitry is realized such that, independently of the selection operated in a configuration phase during the testing on wafer of the device of one or of another serial communication protocol, the largest part of the serial interface circuitry, LPC COMMON INTERFACE (FIG. 5), is unique and is always used when the device operates in serial mode. The selection signal CONF_PROT of the communication protocol enables specific logic circuitry of the selected communication protocol, and disables the specific logic circuitry of the deselected serial communication protocol(s).

In this way, the increment of complexity of the serial interface circuit in terms of number of additional circuit components, is minimized such to imply a negligible increase of the requisite of silicon area of integration.

Figure 3:
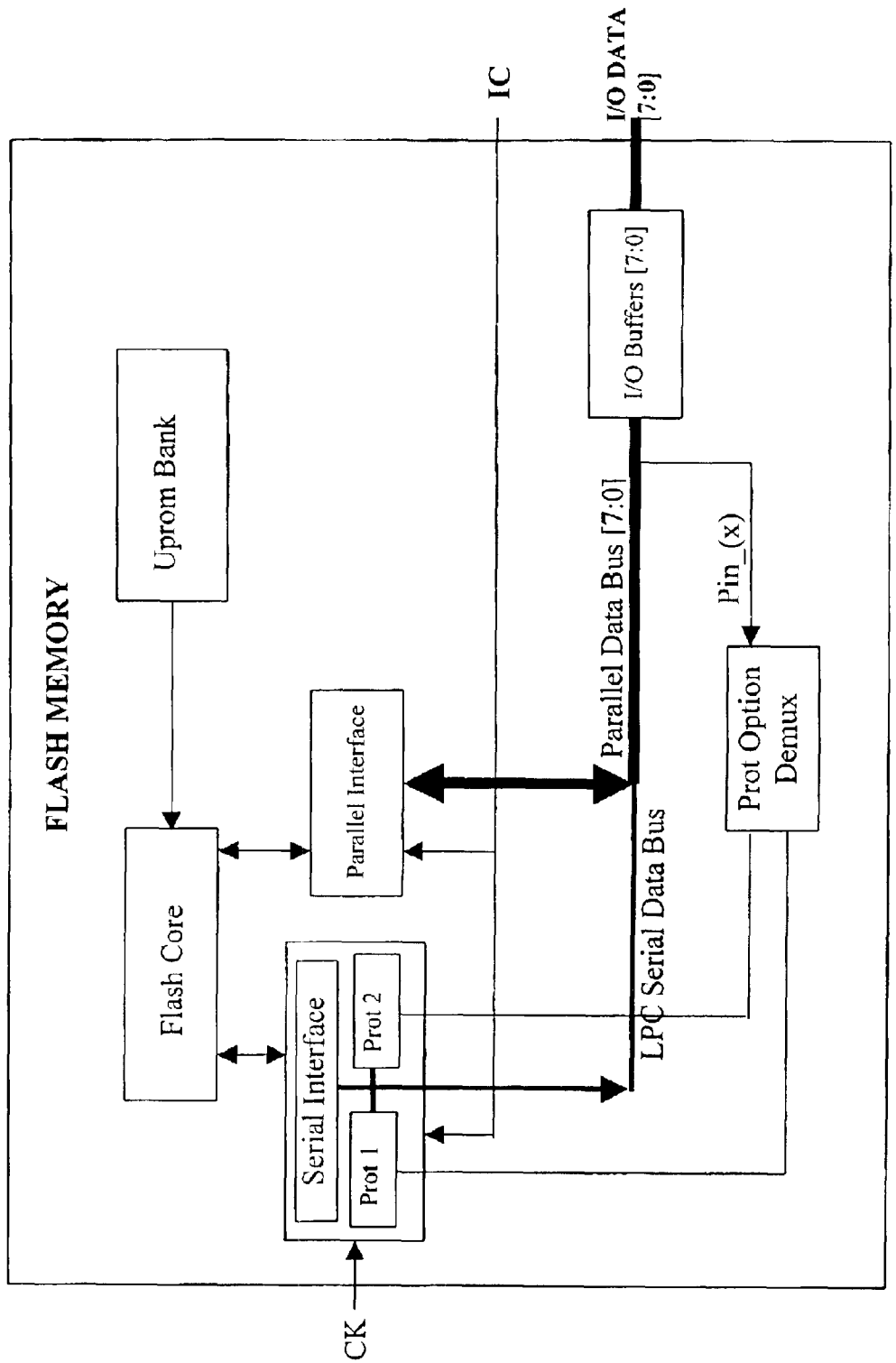
FIG. 3 is a functional block diagram of a nonvolatile memory device realized according to an alternative embodiment.

An alternative embodiment of the invention is shown in FIG. 3.

Differently from the embodiment of FIG. 2, in this case the selection of the desired serial communication protocol may be operated at any time on the finished device by properly biasing a selection pin PIN_(x) of the device.

Given that the selection of the particular serial communication protocol is necessary only when the device is commanded to work in a serial mode, it is possible to dedicate to such a function a pin connected to a line of the data bus (which, in the example shown, has eight lines) that is not engaged for the transfer of data when the memory device is functioning in serial mode, during which for example according to an LPC protocol, uses only four lines of the data bus.

The pin PIN_(x) that is used for setting the desired serial communication protocol, may be the pin connected to a line of the data bus that is used during the functioning in parallel mode of the memory device for inputting the datum to be programmed to the FLASH CORE during a write operation and for outputting (making available to the external world) the datum read from the memory during a read operation.

Figure 4:
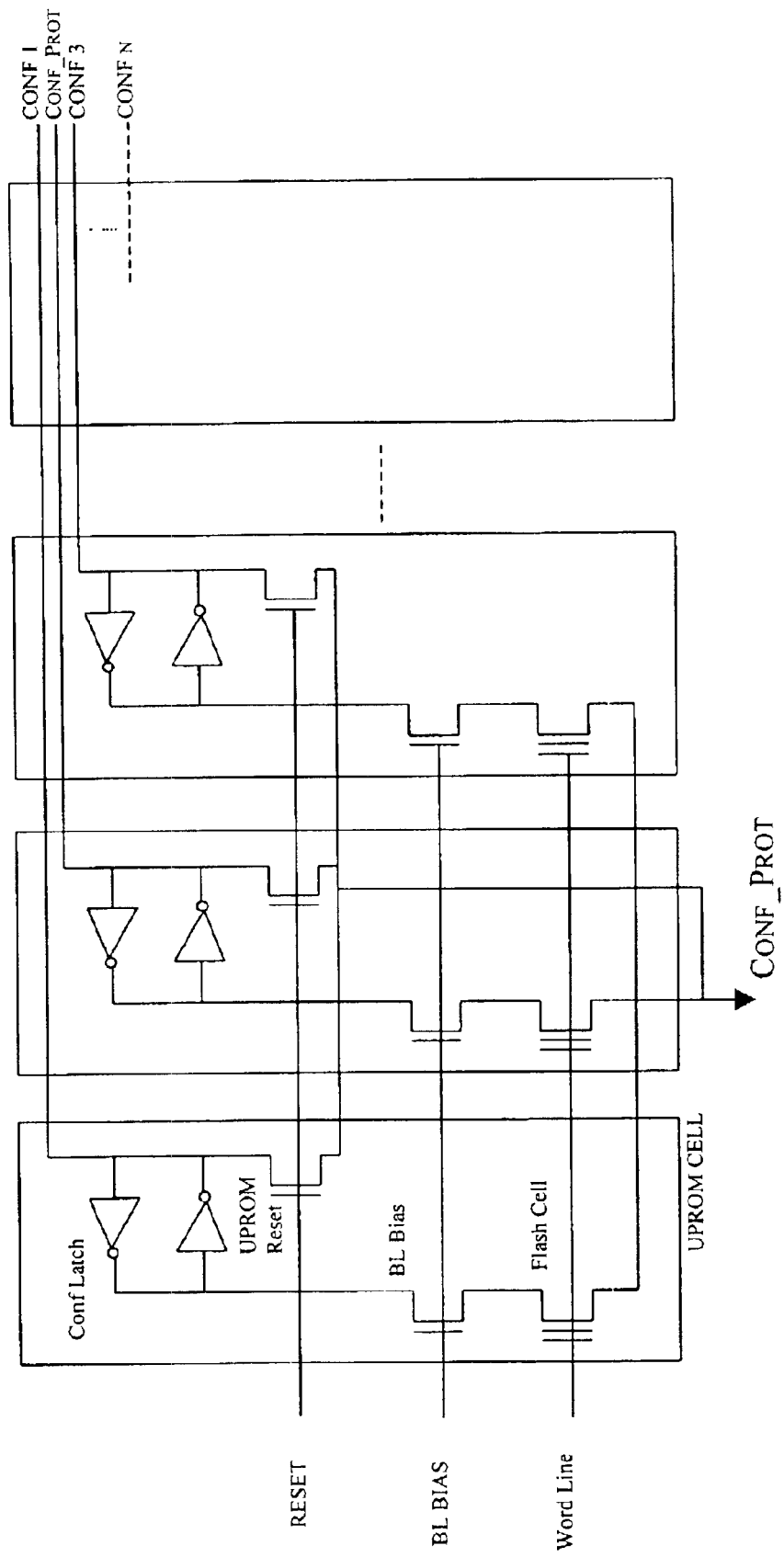
FIG. 4 is a circuit detail that shows a portion of the array of UPROM setting cells of the memory device according to an embodiment.

A sample illustration of an array of nonvolatile configuration cells, each labeled UPROM CELL, which the UPROM BANK of FIGS. 2 and 3 can include, is given in FIG. 4 according to an embodiment of the invention.

Each single cell, UPROM CELL, is composed as shown of a configuration latch, a column bias transistor BL BIAS and a nonvolatile memory cell, FLASH CELL, in which the configuration bit is stored in a nonvolatile manner.

In particular, according to the scheme of FIG. 4, the second cell from the left is dedicated to select a certain serial communication protocol during the testing on wafer of the device being fabricated, according to the embodiment of FIG. 2.

Figure 5:
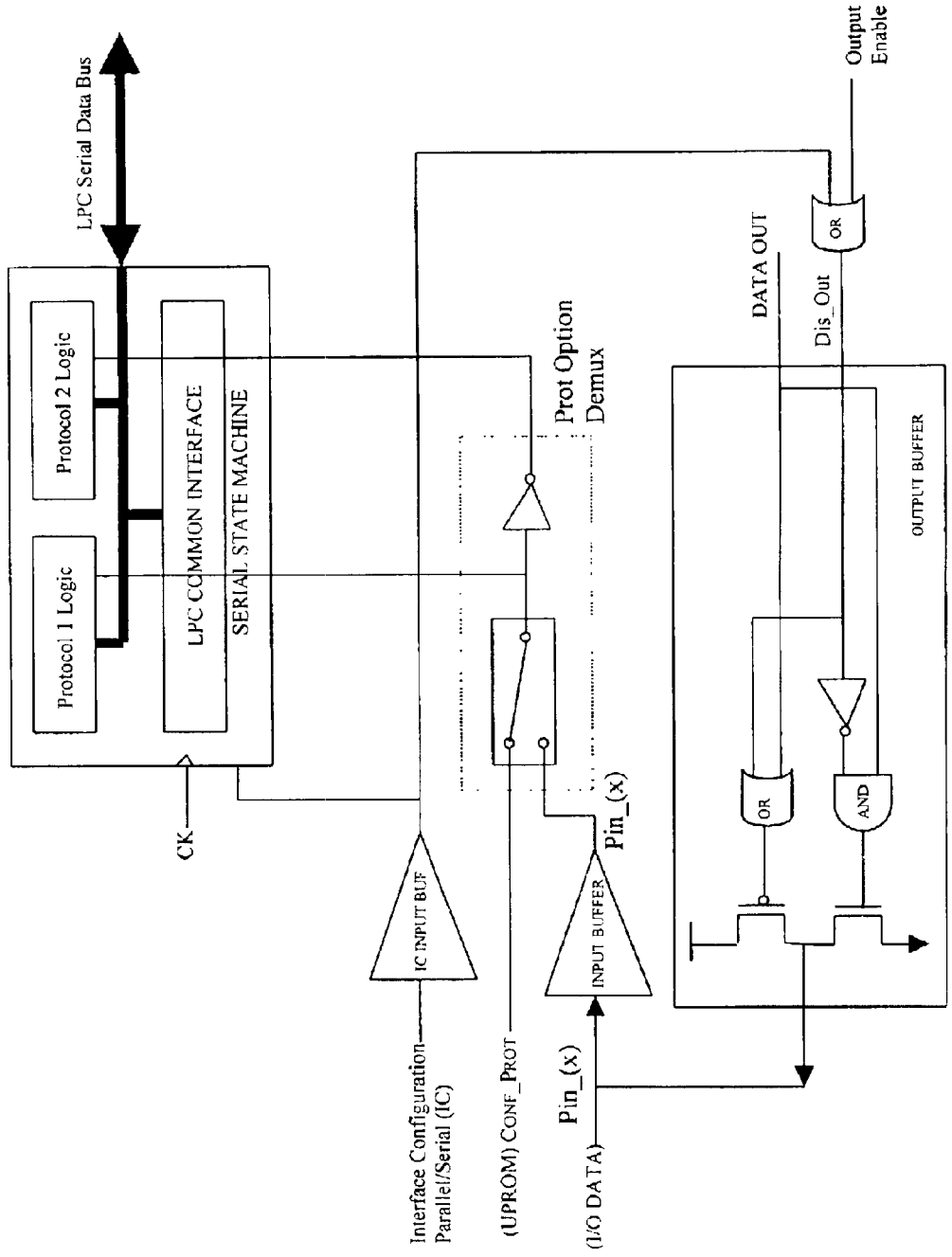
FIG. 5 is a scheme of the serial selection protocol according to an embodiment of the invention.

FIG. 5 is a more detailed view of the circuit of an I/O buffer relative to the pin PIN_(x) of the data bus of the memory device. The circuit diagram illustrates how the output buffer is disabled by the signal DIS_OUT when the device is commanded to operate in serial mode by a selection command (IC) of the functioning mode.

The selection circuit of the protocol, PROT OPTION DEMUX, is identified by the dotted line perimeter, containing the functional elements that operate the disabling of the logic (PROTOCOL_1_LOGIC and PROTOCOL_2_LOGIC) of implementation of the deselected protocol in function of datum that may either be set in a permanent and not modifiable fashion during the testing on wafer in a configuration cell UPROM (CONF_PROT) dedicated to provide the configuration signal that is applied to an input of the selection circuit PROT OPTION DEMUX, or applied through the pin PIN_(x), according to the alternative embodiment of the invention described with reference to the scheme of FIG. 3.

For example, when the memory device operates according to the scheme of FIG. 2, the switch of the PROT_OPTION_DEMUX is in the position shown such that the signal CONF_PROT from the UPROM_BANK controls the selection of the protocol.

Alternatively, when the memory device operates according to the scheme of FIG. 3, the switch of the PROT_OPTION_DEMUX is in the position opposite to that shown, and the IC_INPUT_BUF generates a logic 1 to tri state the OUTPUT_BUFFER. Consequently, the signal PIN_(x) controls the selection of the protocol.

From the foregoing it will be appreciated that, although specific embodiments of the invention have been described herein for purposes of illustration, various modifications may be made without deviating from the spirit and scope of the invention.

What is claimed is:

1. A memory device comprising a nonvolatile standard memory, an array of programmable read only cells for setting during a testing on wafer phase functional parameters of the memory, a serial interface for implementing a certain serial communication protocol, a parallel interface, an input/output data bus to the lines of which are coupled said interfaces and whose lines correspond to as many I/O pins of the device, characterized in that it comprises
   logic circuits in said serial interface, each implementing when selectively enabled, a specific serial communication protocol;
   a selection circuit of one of said serial communication protocols, selectable either permanently settable during the testing on wafer by programming a dedicated cell of said array of read only cells or by an externally applied logic command through a I/O pin;
   the output buffer of said I/O pin being disabled by a disabling signal during the functioning in serial mode of the memory.

2. The device according to claim 1, characterized in that said I/O pin corresponds to a line of said input/output data bus that is not used when the memory is functioning in serial mode.

3. The memory device according to claim 1, characterized in that said different serial communication protocols are of an LPC kind and said serial interface is composed by a common interface circuitry and by distinct logic circuits of implementation of respectively different LPC serial communication protocols, enabled in a mutual exclusive manner by an enabling signal generated by said selection circuit.

4. A memory, comprising:
   an array of memory cells;
   a bus having multiple bus lines; and
   a first interface coupled to the array and to the bus and operatable to receive a protocol-selection signal that causes the first interface to operate according to a corresponding one of at least two protocols.

5. The memory of claim 4, further comprising second interface coupled to the array and to the bus.

6. The memory of claim 4 wherein the first interface comprises a serial interface.

7. The memory of claim 4 wherein the first interface is coupled to some but not all of the bus lines.

8. A memory, comprising:
   an array of memory cells;
   a bus having multiple bus lines;
   a first interface coupled to the array and to the bus and operable to interface all of the bus lines to the array; and
   a second interface coupled to the array and to the bus and operable to receive a protocol-selection value and to interface some but not all of the bus lines to the array according to a protocol selected by the protocol-selection value.

9. The memory of claim 8 wherein the array comprises nonvolatile memory cells.

10. The memory of claim 8 wherein the bus comprises a data bus having multiple data lines.

11. A memory, comprising:
    an array of memory cells;
    a bus having multiple bus lines;
    a first interface coupled to the array and to the bus and operable to interface all of the bus lines to the array;
    a second interface coupled to the array and to the bus and operable to receive a protocol-selection value and to interface some but not all of the bus lines to the array according to a protocol selected by the protocol-selection value; and
    a configuration-selection cell coupled to the second interface and operable to be programmed with the protocol-selection value during testing of the memory and to provide the protocol-selection value to the second interface.

12. A memory, comprising:
    an array of memory cells;
    a bus having multiple bus lines;
    a first interface coupled to the array and to the bus and operable to interface all of the bus lines to the array;
    a second interface coupled to the array and to the bus and operable to receive a protocol-selection value and to interface some but not all of the bus lines to the array according to a protocol selected by the protocol-selection value; and
    wherein the second interface is coupled to one of the bus lines that the second interface does not interface to the array and is operable to receive the protocol-selection value via the one bus line.

13. A memory, comprising:
    an array of memory cells;
    a bus having multiple bus lines;
    a first interface coupled to the array and to the bus and operable to interface all of the bus lines to the array;

a second interface coupled to the array and to the bus and operable to receive a protocol-selection value and to interface some but not all of the bus lines to the array according to a protocol selected by the protocol-selection value;
a configuration-selection cell coupled to the second interface and operable to be programmed with the protocol-selection value during testing of the memory;
wherein one of the bus lines that the second interface does not interface to the array is operable to receive the protocol-selection value; and
a multiplexer operable to selectively couple one of the configuration-selection cell and the one bus line to the second interface.

14. A memory, comprising:
an array of memory cells;
a bus having multiple bus lines;
a parallel interface coupled to the array and to the bus; and
a serial interface coupled to the array and to the bus and configurable to operate according to a selected one of at least two protocols in response to a protocol-selection signal.

15. A memory, comprising:
an array of memory cells;
a bus having multiple bus lines;
a parallel interface coupled to the array and to the bus;
a serial interface coupled to the array and to the bus and configurable to operate according to at least two protocols; and
a configuration-selection cell coupled to the serial interface and operable to be programmed with a protocol-selection value during testing of the memory, the protocol-selection value operable to configure the serial interface to operate according to a corresponding protocol.

16. A memory, comprising:
an array of memory cells;
a bus having multiple bus lines;
a parallel interface coupled to the array and to the bus;
a serial interface coupled to the array and to the bus and configurable to operate according to at least two protocols;
the second interface is coupled to one of the bus lines that the second interface does not interface to the array; and
wherein the one bus line is operable to receive a protocol-selection value operable to configure the serial interface to operate according to a corresponding protocol.

17. A memory, comprising:
an array of memory cells;
a bus having multiple bus lines;
a parallel interface coupled to the array and to the bus;
a serial interface coupled to the array and to the bus and configurable to operate according to at least two protocols;
a configuration-selection cell coupled to the serial interface and operable to be programmed with a first protocol-selection value during testing of the memory;
wherein one of the bus lines that the second interface does not interface to the array is operable to receive a second protocol-selection value; and a selection circuit coupled to the configuration-selection cell and to the one bus line and operable to configure the serial interface to operate according to a selected one of the first and second protocol-selection values.

18. A memory, comprising:
an array of memory cells;
a bus having multiple bus lines;
a parallel interface coupled to the array and to the bus;
a serial interface coupled to the array and to the bus and configurable to operate according to at least two protocols;
wherein the serial interface further comprises,
a respective protocol circuit corresponding to each of the at least two protocols, and
a common interface circuit coupled to the protocol circuits.

19. A memory, comprising:
an array of memory cells;
a bus having multiple bus lines;
a parallel interface coupled to the array and to the bus;
a serial interface coupled to the array and to the bus and configurable to operate according to at least two protocols; and
wherein one of the at least two protocols comprises a low-pin-count (LPC) protocol.

20. A method, comprising:
selecting a protocol with a protocol-selection signal;
configuring an interface according to the selected protocol, the interface configurable in multiple protocols; and
transferring information via the interface according to the selected protocol.

21. The method of claim 20 wherein:
configuring the interface comprises enabling a protocol circuit that corresponds to the selected protocol; and
transferring information comprises transferring information using the protocol circuit.

22. A method, comprising:
configuring an interface according to a protocol, the interface configurable in multiple protocols;
transferring information via the interface according to the protocol;
wherein configuring the interface comprises enabling a protocol circuit that corresponds to the protocol; and
wherein transferring information comprises transferring information using the protocol circuit and a non-protocol-specific circuit.

23. A method, comprising:
configuring an interface according to a protocol, the interface configurable in multiple protocols;
transferring information via the interface according to the protocol; and
wherein configuring the interface comprises programming a protocol-selection element.

24. A method, comprising:
configuring an interface according to a protocol, the interface configurable in multiple protocols;
transferring information via the interface according to the protocol; and
wherein configuring the interface comprises programming a protocol-selection element during testing of an integrated circuit that incorporates the interface and the element.

25. The method of claim 20 wherein selecting the protocol comprises selecting the protocol with a protocol-selection signal that is coupled to the interface.

* * * * *